United States Patent [19]
Sobelman

[11] Patent Number: 6,061,815
[45] Date of Patent: May 9, 2000

[54] PROGRAMMING UTILITY REGISTER TO GENERATE ADDRESSES IN ALGORITHMIC PATTERN GENERATOR

[75] Inventor: Michael J. Sobelman, San Jose, Calif.

[73] Assignee: Schlumberger Technologies, Inc., San Jose, Calif.

[21] Appl. No.: 08/762,611

[22] Filed: Dec. 9, 1996

[51] Int. Cl.[7] .................................................. G01R 31/28
[52] U.S. Cl. ........................... 714/738; 714/743; 714/718
[58] Field of Search .................................... 714/738, 739, 714/742, 743, 718; 365/201; 395/421.07, 421.08

[56] References Cited

U.S. PATENT DOCUMENTS

| | | | |
|---|---|---|---|
| 4,402,081 | 8/1983 | Ichimiya et al. | 371/21.1 |
| 4,442,519 | 4/1984 | Jones et al. | 371/27.1 |
| 4,574,348 | 3/1986 | Scallon | 364/200 |
| 4,586,181 | 4/1986 | Shimizu | 714/738 |
| 4,807,229 | 2/1989 | Tada | 714/738 |
| 4,862,460 | 8/1989 | Tamaguchi | 714/738 |
| 4,905,183 | 2/1990 | Kawaguchi et al. | 714/738 X |
| 5,050,170 | 9/1991 | Abdoo | 714/738 |
| 5,062,109 | 10/1991 | Ohshima et al. | 714/719 |
| 5,127,010 | 6/1992 | Satoh | 371/27.1 |
| 5,151,903 | 9/1992 | Mydill et al. | 371/27.1 |
| 5,285,453 | 2/1994 | Gruodis | 714/738 |
| 5,363,382 | 11/1994 | Tsukakoshi | 714/719 |
| 5,420,870 | 5/1995 | Kim | 371/27.1 |
| 5,453,995 | 9/1995 | Behrens | 714/738 |
| 5,463,570 | 10/1995 | Nakata | 364/745 |
| 5,537,420 | 7/1996 | Huang | 371/2.1 |
| 5,596,616 | 1/1997 | Jeang | 377/56 |

*Primary Examiner*—Hoa T. Nguyen
*Attorney, Agent, or Firm*—Fish & Richardson P.C.

[57] ABSTRACT

A algorithmic pattern generator (APG) in a memory tester having a programmable first ALU generating an first value on a first output data path; a programmable Z ALU generating a Z value on an Z output data path; and a programmable second ALU having terminals to receive the Z value from the Z ALU and a circuit to insert bits of the received Z value into low order bits of a second value before outputting the second value on a second output data path. In embodiments, the first value and the second value are generated to define a location in an array of memory cells of a memory under test; and the second value contains low order bits corresponding to address bits that are incremented internally by the memory under test in a burst mode of operation. Also, a method of programming a memory tester APG to test a memory device including providing to the APG for execution a single instruction setting a value representing a non-zero burst length n and a value representing a non-zero seed for generating interleaved addresses. In embodiments, the method includes providing an increment instruction to a counter n times for execution by the APG without an intervening instruction to reset the counter; and using the n values of the counter from the preceding step to form n addresses to test the memory device in a burst mode of operation with an interleaved addressing mode.

22 Claims, 2 Drawing Sheets

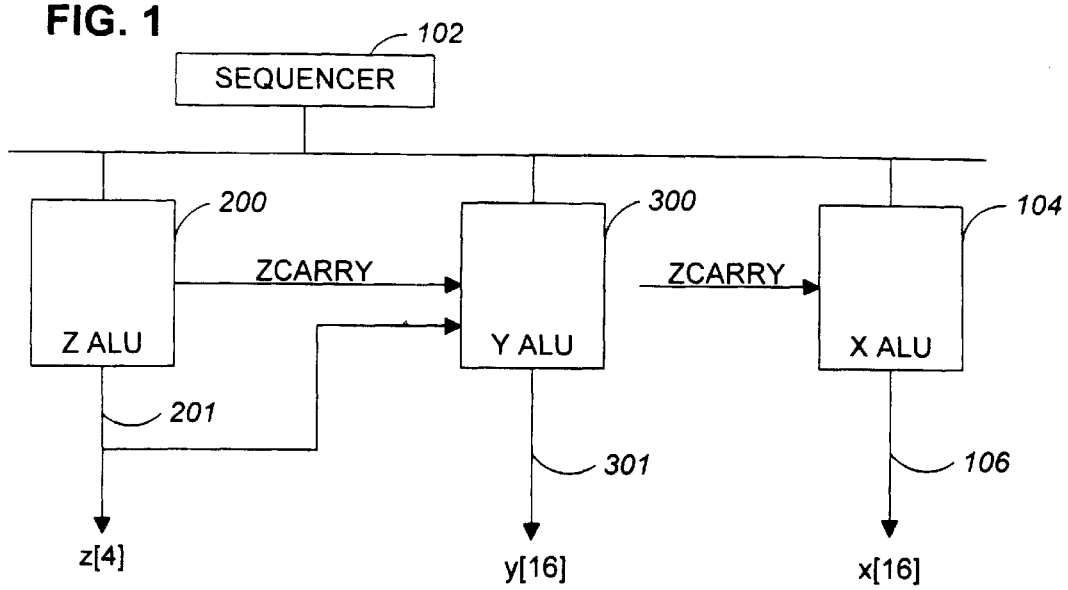
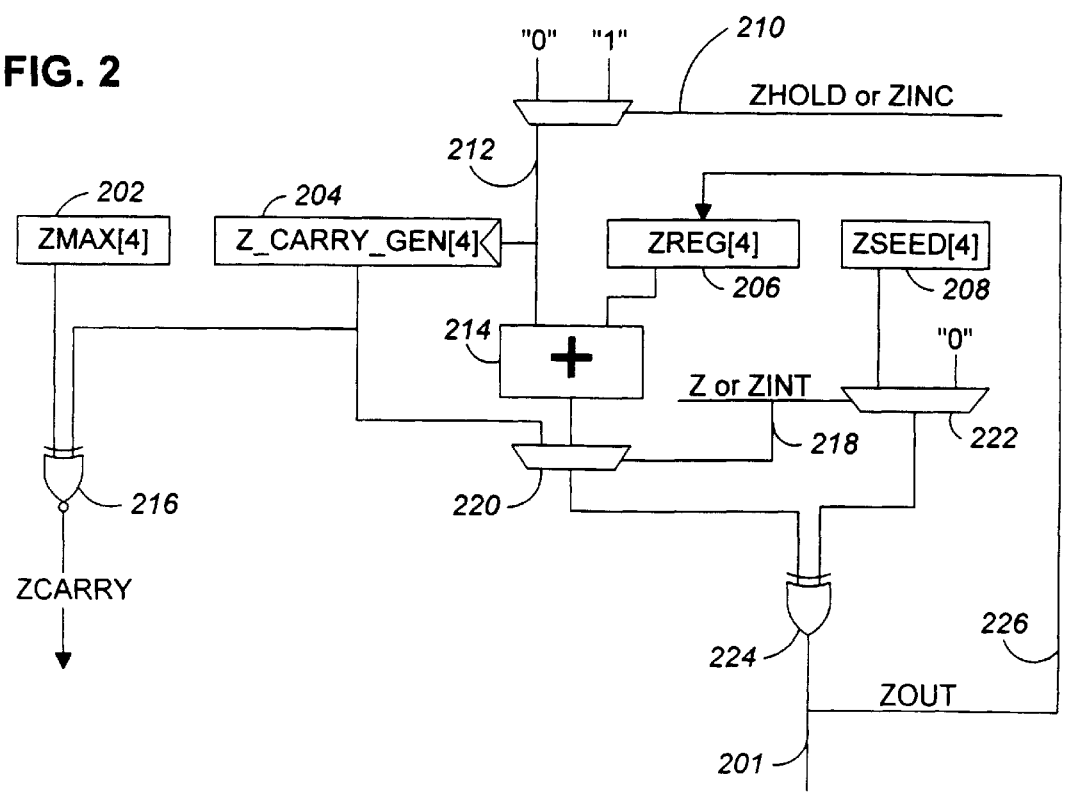

PROGRAMMING UTILITY REGISTER TO GENERATE ADDRESSES IN ALGORITHMIC PATTERN GENERATOR

BACKGROUND

The present invention relates to algorithmic pattern generators in automatic test equipment for testing memory devices, and more particularly to algorithmic pattern generators useful for testing synchronous semiconductor random access memory devices.

Algorithmic pattern generators (APGs) are well-known components of automatic test equipment for electronic circuits. In one conventional design, the APG is essentially special purpose, very high speed RISC processor having a very long instruction word (VLIW) architecture. In such an architecture, each functional block or arithmetic logic unit (ALU) of the APG has a corresponding set of instruction bits in the APG instruction word. Typically, an APG generates addresses in two parts, X and Y, and thus has an X register and a Y register, each generally wide enough to form half an address for a target memory device. To test a memory addressable by a 32-bit address, for example, X and Y registers of 16 bits each would be sufficient. In addition, an APG typically has a small utility register called the Z register. Each of these registers is subject to manipulation by APG instructions.

Memory testers must test memories having a number of challenging operating modes. In a burst mode of operation, a memory uses an internal address generating means to generate addresses for itself in response to a clock signal. From a start address, words of data are read from, or written to, the memory up to the burst length, which is programmable by setting a register in the memory. A typical set of selectable values is 1 (no burst), 2, 4, and 8 words per burst.

In burst mode, an addressing mode (or wrap type) of either "sequential" or "interleaved" specifies the order in which the burst data will be addressed. The interleaved mode is also known as Intel addressing mode. The addressing mode may be programmed by setting a register in the memory. To illustrate addressing mode operation, in the sequential mode, for a burst length of 8, the low order 3 bits of the starting address are incremented modulo 8 through eight addresses before the next higher address bit is incremented, while the interleave mode, the low order 3 bits of the address are formed as the exclusive or (XOR) of the starting address low order 3 bits and a counter counting from zero to 7. With a starting address having low order starting bits 010 (binary), the low order 3 bits of the interleave address sequence are 2, 3, 0, 1, 6, 7, 4, and 5 (decimal).

SUMMARY

The invention provides a Z register architecture and method of operation that simplifies the programming of tests for memory devices having burst, interleaved or sequential, and wrapping modes of addressing.

In general, in one aspect, the invention features an algorithmic pattern generator (APG) in a memory tester. The APG has a programmable first ALU generating an first value on a first output data path; a programmable Z ALU generating a Z value on an Z output data path; and a programmable second ALU having terminals to receive the Z value from the Z ALU, and a circuit to insert bits of the received Z value into low order bits of a second value before outputting the second value on a second output data path. Preferred embodiments of the invention include one or more of the following features. The first ALU is an X ALU, the first value is an X value, the second ALU is a Y ALU, and the second value is a Y value. The first value and the second value are generated to define a location in an array of memory cells of a memory under test; and the second value contains low order bits corresponding to address bits that are incremented internally by the memory under test in a burst mode of operation. The second ALU includes a terminal receiving a ZCARRY signal from the Z ALU; and a circuit incrementing a second value by a step value in response to an ALU instruction that tests the ZCARRY signal, where the step value is a burst length of a memory device under test in a burst mode of operation.

In general, in another aspect, the invention features a method of programming an APG in a memory tester to test a memory device. The method includes providing to the APG for execution by the APG a single instruction setting a value representing a non-zero burst length n and a value representing a non-zero seed for generating interleaved addresses. Preferred embodiments of the invention include one or more of the following features.

The APG has a very long instruction word (VLIW) instruction format. The method includes providing an increment instruction to a counter n times for execution by the APG without an intervening instruction to reset the counter; and using the n values of the counter from the preceding step to form n addresses to test the memory device in a burst mode of operation with an interleaved addressing mode. The burst length is selected from the group consisting of 4, 8, and 16.

In general, in another aspect, the invention features an APG in a memory tester programmable by instructions to load in a seed register a seed value representing a non-zero seed; to load in a limit register a value representing a non-zero burst length n of a burst mode of operation of a memory device under test; to set or clear an interleave mode signal; and to count a counter through n distinct values from zero to n−1 starting with the non-zero seed to form an interleaved addresses when the interleave mode signal is present and a sequential addresses otherwise, and to assert a carry signal from the counter only when all n distinct values have been formed. Preferred embodiments of the invention include one or more of the following features. The APG is further programmable by instructions to form a value for use as a coordinate of a memory cell location in a memory array of the memory device under test; and to insert the $\log_2 n$ low order bits of the counter as the low order bits of the value. The value is a Y value. The APG is further programmable by instructions to test the value of the carry signal and if it is set increment a value by a step value of programmable size. The APG is further programmable by instructions to test the value of the carry signal and if it is set decrement a value by a step value of programmable size.

Among the advantages of the invention are one or more of the following. The invention requires a minimal number of additional bits in the APG instruction word. Using the Z register of the invention, a programmer can program a memory tester for burst mode devices simply by setting the registers and starting a count: the ALU of the APG need not be programmed to handle the wrapping of addresses in burst mode even when the starting address has non-zero low order bits. This transparency of tester operation to the value of the start address saves pattern memory in that less of it is required to program the APG. In addition, it allows the reuse of libraries of standard patterns for testing memory without regard to the operating mode of the memory being tested.

Other features and advantages of the invention will become apparent from the following description and from the claims.

BRIEF DESCRIPTION OF THE DRAWINGS

FIG. 1 is a schematic block diagram of a portion of an algorithmic test pattern generator (APG) illustrating an aspect of the invention.

FIG. 2 is a schematic block diagram of a portion of the Z register ALU (arithmetic logic unit) of the APG of FIG. 1.

DETAILED DESCRIPTION

Figure 3:
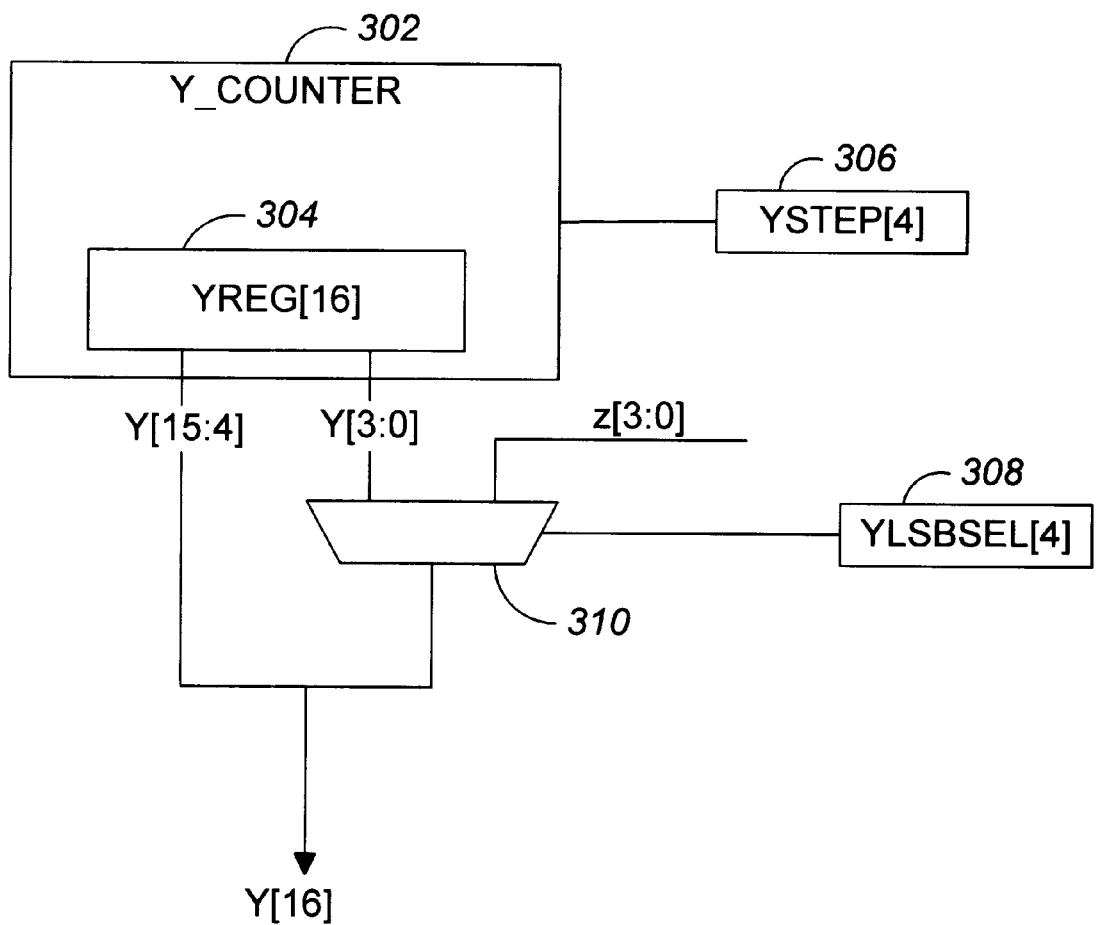
FIG. 3 is a schematic block diagram of a portion of the Y register ALU of the APG of FIG. 1.

Referring to FIG. 1, an algorithmic test pattern generator (APG) includes a sequencer 102, a Z ALU 200, a Y ALU 300 and an X ALU 104. The X ALU and the Y ALU have output terminals 106 and 301, respectively, at which they provide an X value and a Y value, x[16] and y[16], respectively, which are used by the APG to form a memory device address. The Y value is also used in the generation of address dependent test data. The notation d[n] indicates that the data d is n bits wide. The notation d[n:m] indicates bits n through m of d, with bit zero being the least significant bit.

The X and Y ALUs receive from the Z ALU a signal ZCARRY, the generation and use of which will be described. The Y ALU also receives from Z ALU output terminal 201 the data z[4] generated by the Z ALU as will be described.

The sequencer 102 provides ALU instructions to each of the X, Y, and Z ALUs. Each of the ALU instructions is a part of a VLIW instruction retrieved by the sequencer from an ALU instruction memory (not shown) through operation of a sequence control program. Insofar as it affects the present invention, the sequencer may be of a conventional, known design.

The x[16] and y[16] data produced by the X and Y ALUs identify the position of a memory cell in an array of a size as large as $2^{16} \times 2^{16}$ (for x and y that are 16 bits wide). It is conventional to program test patterns in terms of actual location in the array because it is desirable to test for effects related to the physical arrangement of stored bits in a device. However, the actual x and y locations cannot generally be used as addresses to the device because memory devices generally scramble the mapping of address input to memory cell. Thus, a memory tester will have circuitry downstream from the X and Y registers to compensate for this behavior of the device under test and generate physical addresses. Insofar as it affects the present invention, the downstream circuitry may be of a conventional, known design.

Referring to FIG. 2, the Z ALU 200 (FIG. 1) includes a ZMAX[4] register 202, a Z_CARRY_GEN[4] counter circuit 204, a ZREG[4] register 206 (the Z register), and a ZSEED[4] register 208. Parenthetically, it will be noted that the figures here are simplified and conceptual so as to present a clear picture of the features of the invention. For example, the figures do not show the pipeline structure of the APG used to achieve high speed in a production implementation. The figures also show as separate structures the ZREG and ZSEED registers: these are redundant (as will be seen from the following description) and thus a production implementation would include only one, shared physical register.

A signal ZHOLD or ZINC 210 set by an ALU instruction is used to generate a datum of zero (for hold) or one (for increment) on line 212, which is connected to input terminals of the counter 204 and to an input of an adder 214. The other input to adder 214 is the Z register 206, so that during each cycle of the APG, either zero or one is added to the Z register, depending on the state ZHOLD or ZINC.

An ALU instruction loads both the ZMAX register 202 and the counter 204 with the burst length minus 1 of the memory device under test. The burst length minus 1 is also used as a mask on the counter, in effect setting its width. (The burst length is always an integral power of 2.) Thus, when the burst length is set by an ALU instruction to 4, the counter 204 becomes a modulo 4 counter. In each clock cycle in which Z is incremented (ZINC is true, signal 212 is one), the counter 204 also increments. When it reaches the burst length minus 1, the values in ZMAX register 202 and the value of counter 204 are the same, so that the output of NOT-XOR gate 216 asserts a carry signal ZCARRY. This occurs when a burst-length number of z values have been produced by the Z ALU and so marks the end of a burst.

Initializing the counter 204 to the burst length minus 1 causes an immediate ZCARRY on the first increment of the Z ALU registers. This is done because the APG design has "this cycle"—rather than "next cycle"—timing; in a "next cycle" design, the initial counter value would be zero.

The counter 204 may also be used to generate an interleaved sequence of values when the interleaved mode of operation is in effect. In interleaved operation, the signal Z or ZINT on line 218 selects the output of counter 204 as input to multiplexer (mux) 220 and the ZSEED 208 input to mux 222. XOR gate 224 generates the exclusive or (XOR) of the seed and the counter value, generating the Intel sequence based on the seed. Before the counting begins, an ALU instruction loads the ZMAX register 202 with a burst length minus 1 and the seed register 208 with a seed value for an interleave sequence. The seed value may be non-zero, which is all that is required to cause the Z ALU to operate in wrap mode. Note that when this Z ALU architecture is programmed as has been described, the ZCARRY signal is generated at the proper time out of gate 216 even in interleaved addressing mode with a non-zero seed, which causes the numeric wrap-around of the generated addresses to occur in the middle of the burst. Note also that the seed value can be changed without any other programming change being required, so that interleaved mode programming can be added to existing APG programming with very little effort.

In the sequential (i.e., non-interleaved) mode of operation, mux 222 passes zero to one input of XOR gate 224, so that the gate merely passes its other input through to its output. In sequential mode, mux 220 selects the output of adder 214. The output of adder 214 in this situation is either the value of the Z register (ZHOLD is true, zero on line 212) or the Z register incremented by one (ZINC is true, one on line 212). The value passes through gate 224 and is stored in the Z register 206, effecting an increment Z or a hold Z instruction from the sequencer.

Pertinent aspects of the operation of the Z ALU may also be seen in its instruction set. The Z ALU responds to ALU instructions from the sequencer, including the instructions listed in the following table.

| Instruction | Comment |
| --- | --- |
| HOLDZ | Keep Z registers unchanged. |
| ZBURST | Load ZSEED register and ZMAX register with operands specified in instruction. |
| LDZ | Load Z register for wrap mode (clear ZINT) |
| INTLDZ | Load Z register for interleave mode (set ZINT) |

-continued

| Instruction | Comment |
| --- | --- |
| INCZ | Increment Z register. |
| INCZ@XCARRY | Increment Z only if XCARRY (from the X ALU) is true. |
| INCZ@YCARRY | Increment Z only if YCARRY (from the Y ALU) is true. |

Referring to FIG. 3, the Y ALU includes a Y_COUNTER circuit 302 that includes a Y[16] register 304; a YSTEP[16] register 306; and a YLSBSEL[4] register 308. The Y_COUNTER circuit is connected to receive as input the value in the YSTEP register 306 and to increment or decrement by that value the contents of the Y register 304 in response to ALU instructions. In particular, an instruction is provided to increment the Y register by YSTEP if ZCARRY is true. With YSTEP set to the burst length, use of this instruction causes the high order part of Y to be incremented by the proper amount at the proper time, as the Z ALU generates low order bits for interleaved or sequential mode addressing.

The YLSBSEL register 308 can be loaded by an ALU instruction to select which bits, if any, of the z output of the Z ALU are to be substituted for the corresponding low order bits of the Y register 304 to produce a modified Y output from mux 310 for use downstream in the APG. With YLSBSEL set to the burst length minus 1 (e.g., to 7 if the burst length is 8), the low order address bits generated by the Z ALU are inserted directly into the Y value. This arrangement gives the ALU programmer the convenience of programming with a Z register without requiring the tester to provide a signal path to the memory under test that includes the width of the Z register.

Pertinent aspects of the operation of the Y ALU may also be seen in its instruction set. The Y ALU responds to ALU instructions from the sequencer, including the instructions listed in the following table.

| Instruction | Comment |
| --- | --- |
| HOLDY | Keep Y register unchanged. |
| LDY | Load Y register with operand specified in instruction. |
| LDYSTEP | Load YSTEP register with operand specified in instruction. |
| INCY | Increment Y register by value in YSTEP register. |
| DECY | Decrement Y register by value in YSTEP register. |
| INCY@ZCARRY | Y = Y + YSTEP only if ZCARRY = 1. |
| DECY@ZCARRY | Y = Y − YSTEP only if ZCARRY = 1. |
| YLSB = 0 | Load YLSBSEL register with zero (no bits from Z are inserted). |
| YLSB = Z0 | Load YLSBSEL register with 1 (z[0:0] is inserted for y[0:0]). |
| YLSB = Z1 | Load YLSBSEL register with 3 (z[1:0] is inserted for y[1:0]). |
| YLSB = Z2 | Load YLSBSEL register with 7 (z[2:0] is inserted for y[2:0]). |
| YLSB = Z3 | Load YLSBSEL register with 15 (z[3:0] is inserted for y[3:0]). |

In an alternative embodiment, the YSTEP value and the YLSBSEL value are both set according to the burst length, and separate registers are not implemented.

Referring again to FIG. 1, the X ALU 104, like the Y ALU 300, receives the ZCARRY signal from the Z ALU 200 and supports instructions incrementing and decrementing an X register if ZCARRY is true. In the described embodiment, the X ALU 104 differs from the Y ALU 300 in that it does not provide for the substitution of Z bits for low order X bits, as the Y ALU provides for the substitution of low order Y bits. In other embodiments, the substitution is provided for in the X ALU or in both X and Y ALUs with or without a second substitution counter.

Other embodiments are within the scope of the following claims. The Z ALU registers can have a width other than 4, with the width preferably being a power of 2 and greater than 8. The X ALU and the Y ALU can produce x and y values with a width other than 16, with a width preferably 12 or greater and preferably a power of 2.

What is claimed is:

1. An algorithmic pattern generator (APG) in a memory tester, comprising:
   a programmable first ALU generating an first value on a first output data path;
   a programmable Z ALU generating a Z value on an Z output data path; and
   a programmable second ALU having terminals to receive the Z value from the Z ALU, and
   a circuit to insert bits of the received Z value into low order bits of a second value before outputting the second value on a second output data path.

2. The APG of claim 1 where the first ALU is an X ALU, the first value is an X value, the second ALU is a Y ALU, and the second value is a Y value.

3. The APG of claim 1 where:
   the first value and the second value are generated to define a location in an array of memory cells of a memory under test; and
   the second value contains low order bits corresponding to address bits that are incremented internally by the memory under test in a burst mode of operation.

4. The APG of claim 1 where the second ALU comprises:
   a terminal receiving a ZCARRY signal from the Z ALU; and
   a circuit incrementing a second value by a step value in response to an ALU instruction that tests the ZCARRY signal, where the step value is a burst length of a memory device under test in a burst mode of operation.

5. The APG of claim 1 where the Z ALU comprises:
   a programmable seed register for storing a seed value representing a seed;
   a programmable limit register for storing a value representing a non-zero burst length n of a burst mode of operation of a memory device under test; and
   a counter circuit configured to count through n distinct values from zero to n-1 according to the value stored in the limit register.

6. A method of programming an algorithmic pattern generator (APG) in a memory tester, comprising:
   providing to the APG for execution by the APG a single instruction setting a value representing a non-zero burst length n and a value representing a seed for generating interleaved addresses.

7. The method of claim 6 where the APG has a very long instruction word (VLIW) instruction format.

8. The method of claim 6 where the burst length is selected from the group consisting of 4, 8, and 16.

9. A method of forming addresses to test a memory device operating in a burst mode with interleaved addressing, comprising:

providing to an algorithmic pattern generator (APG), for execution by the APG, a single instruction setting a value representing a non-zero burst length n and a value representing a seed for generating interleaved addresses;

providing to the APG, for execution by the APG, instructions to increment a counter, without any intervening instruction to reset the counter, to generate n values of the counter; and using the n values of the counter and the value representing a seed to form n interleaved addresses to test the memory device.

10. The method of claim 9 where the APG has a very long instruction word (VLIW) instruction format.

11. The method of claim 10 where the burst length is selected from the group consisting of 4, 8, and 16.

12. The method of claim 9 where the burst length is selected from the group consisting of 4, 8, and 16.

13. An algorithmic pattern generator (APG) in a memory tester programmable by instructions to:

load in a seed register a seed value representing a seed;

load in a limit register a value representing a non-zero burst length n of a burst mode of operation of a memory device under test;

set or clear an interleave mode signal; and count a counter through n distinct values from zero to n−1 starting with the seed to form interleaved addresses when the interleave mode signal is present and sequential addresses otherwise, and to assert a carry signal from the counter only when all n distinct values have been formed, the counting of the counter being limited to n values by the value loaded in the limit register.

14. The APG of claim 13 further programmable by instructions to:

test the value of the carry signal and if the carry signal is set, increment a value by a step value of programmable size.

15. The APG of claim 13 further programmable by instructions to:

test the value of the carry signal and if the carry signal is set, decrement a value by a step value of programmable size.

16. The APG of claim 13 further programmable by a single, very long instruction word (VLIW) instruction to load the seed register, to load the limit register, and to initialize the counter, the execution by the APG of the single instruction being sufficient to change the burst length and the seed value used by the APG to generate addresses.

17. An algorithmic pattern generator (APG) in a memory tester programmable by instructions to:

load in a seed register a seed value representing a seed;

load in a limit register a value representing a non-zero burst length n of a burst mode of operation of a memory device under test, set or clear an interleave mode signal;

count a counter through n distinct values from zero to n−1 starting with the seed to form interleaved coordinate values when the interleave mode signal is present and sequential coordinate values otherwise, and to assert a carry signal from the counter only when all n distinct values have been formed, the counting of the counter being limited to n values by the value loaded in the limit register, the coordinate values being for use as coordinates of memory cell locations in a memory array of the memory device under test; and insert the $\log_2 n$ low order bits of the value of the counter as the low order bits of each coordinate value.

18. The APG of claim 17 where the coordinate value is a Y value.

19. The APG of claim 17 further programmable by instructions to:

test the value of the carry signal and if the carry signal is set, increment the coordinate value by a step value of programmable size.

20. The APG of claim 17 further programmable by instructions to:

test the value of the carry signal and if the carry signal is set, decrement the coordinate value by a step value of programmable size.

21. The APG of claim 17 where the coordinate value is a Y value, the APG being further programmable by instructions to:

test the value of the carry signal and if the carry signal is sets increment the coordinate value by a step value of programmable size; and test the value of the carry signal and if the carry signal is sets decrement the coordinate value by a step value of programmable size.

22. The APG of claim 17 further programmable by a single, very long instruction word (VLIW) instruction to load the seed register, to load the limit register, and to initialize the counter, the execution by the APG of the single instruction being sufficient to change the burst length and the seed value used by the APG to generate addresses.

* * * * *